(12) United States Patent
Jang

(10) Patent No.: US 7,463,524 B2
(45) Date of Patent: Dec. 9, 2008

(54) READING AND WRITING METHOD FOR NON-VOLATILE MEMORY WITH MULTIPLE DATA STATES

(75) Inventor: Wen-Yueh Jang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 257 days.

(21) Appl. No.: 11/588,249

(22) Filed: Oct. 27, 2006

(65) Prior Publication Data

US 2008/0101127 A1    May 1, 2008

(51) Int. Cl.
*G11C 11/34* (2006.01)
*G11C 16/04* (2006.01)

(52) U.S. Cl. .......................... 365/185.19; 365/185.03; 365/149

(58) Field of Classification Search ............ 365/185.19, 365/185.03, 149
See application file for complete search history.

(56) References Cited

U.S. PATENT DOCUMENTS

| | | | |
|---|---|---|---|
| 5,329,485 A * | 7/1994 | Isono et al. ................. 365/145 |
| 6,473,332 B1 | 10/2002 | Ignatiev et al. |
| 6,673,691 B2 | 1/2004 | Zhuang et al. |
| 2006/0083098 A1 * | 4/2006 | Ho ......................... 365/230.05 |
| 2007/0268744 A1 * | 11/2007 | Taguchi ................. 365/185.01 |

* cited by examiner

*Primary Examiner*—Anh Phung
*Assistant Examiner*—Toan Le
(74) *Attorney, Agent, or Firm*—Muncy, Geissler, Olds & Lowe, PLLC

(57) ABSTRACT

The invention provides a reading method for a memory with multiple data states by applying a plurality of reading signals to an MIM element coupled to a memory cell. The logic level of the data stored in the memory cell is determined based on the number of the reading signals required to switch the state of the MIM element from a first state to a second state.

14 Claims, 5 Drawing Sheets

| Reading Signal \ Logic States of MIM element | First Reading Signal | Second Reading Signal | Third Reading Signal | Fourth Reading Signal |
|---|---|---|---|---|
| Logic State 0 | L | L | L | H |
| Logic State 1 | L | L | H | H |
| Logic State 2 | L | H | H | H |
| Logic State 3 | H | H | H | H |

FIG. 4

READING AND WRITING METHOD FOR NON-VOLATILE MEMORY WITH MULTIPLE DATA STATES

BACKGROUND OF THE INVENTION

1. Field of the Invention

The present invention relates to a reading and writing method for a memory, and more particularly to a reading and writing method for a non-volatile memory with more than two data states.

2. Description of the Related Art

Portable electronic devices, such as cell phones, digital cameras and PDAs, electronic device are typically in standby mode or sleep mode more than in an operating mode. Non-volatile memory is required to ensure that data stored in an electronic device can be preserved without power. Currently memory cells of memory devices store only two data states. If the portable electronic device requires greater memory capacity, the only way to increase capacity is to increase the number of memory cells. In other words, the memory matrix of the memory device increases, thus, the size of the memory device increases. In order to increase the memory capacity and avoid increasing the volume of memory, a memory device with multiple data states is required. Currently, memory devices with multiple data states are achieved by the different resistance of the memory cells and if the resistance variation range is not great enough, the data state may be incorrectly determined. Magnetoresistive random access memory (MRAM), ovonic universal memory (OUM), resistive random access memory (RRAM) are memory devices with multiple data states generating the most interest. FIG. 1 is a schematic diagram of a memory cell of RRAM. Memory cell 10 comprises transistor T1 and metal-insulator-metal (MIM) element 11. The resistance of the MIM element 11 can be changed by applying a bias voltage via the node N. When the memory cell 10 is read by a reading voltage applying to the MIM element, the data state of data stored in the memory cell 10 is determined by current passing through the MIM element. However, if the resistance variation range is not great enough, the current difference between data states is not easily determined, thus, the data states may be incorrectly determined.

BRIEF SUMMARY OF THE INVENTION

The invention provides a reading method for a memory device having a MIM element comprising: inputting at least one read signal to the MIM element; detecting whether the state of the MIM element changes; when the MIM element changes state, determining the data stored in the MIM element based on the number of the input reading signal.

The invention provides a reading method for a memory device having a MIM element comprising: determining a transition voltage and a transition time of the MIM element, wherein the transition voltage switches the MIM element from a first state to a second state and the transition time is the shortest switching time for switching the MIM element from the first state to the second state; determining N logic states of the MIM element, wherein N is more than two; providing a reading signal, wherein the reading signal has a reading voltage more than the transition voltage and a reading cycle T, wherein a product of N and T is larger than the transition time; selecting a memory cell via a word line and a bit line of the memory; inputting a series of the reading signal to the memory cell via the bit line; determining the logic state of the data to be (N-M) when the MIM element switches to the second state at the Mth reading signal.

The invention provides a writing method for a memory device having a MIM element comprising: determining a transition voltage and a transition time of the MIM element, wherein the transition voltage switches the MIM element from a first state to a second state and the transition time is the shortest switching time for switching the MIM element from the first state to the second state; determining N logic states of the MIM element, wherein N is more than two; providing a writing signal, wherein the writing signal has a writing voltage more than the transition voltage and a writing cycle T, wherein a product of N and T is larger than the transition time; selecting a memory cell; when a data at logic state M is written to the memory cell, inputting M writing signal to the MIM element.

The invention provides an accessing method for a memory device having a MIM element comprising: determining a first transition voltage and a first transition time of the MIM element, wherein the first transition voltage switches the MIM element from a first state to a second state and the first transition time is the shortest switching time for switching the MIM element from the first state to the second state; determining a second transition voltage and a second transition time of the MIM element, wherein the second transition voltage switches the MIM element from the second state to the first state and the second transition time is the shortest switching time for switching the MIM element from the second state to the first state; determining N logic states of the MIM element, wherein N is more than two; providing a reading signal, wherein the reading signal has a reading voltage more than the first transition voltage and a reading cycle T, wherein a product of N and T is larger than the first transition time; providing a writing signal, wherein the writing signal has a writing voltage more than the second transition voltage and a writing cycle T, wherein a product of N and T is larger than the second transition time; selecting a memory cell via a word line and a bit line of the memory; when the memory cell is at a writing mode, applying at least one writing signal to the MIM element of the memory cell via the bit line based on the data state of a writing data; when the memory cell is at a reading mode, applying at least one reading signal to the memory cell and determining the logic state of the data stored in the memory cell when the MIM element switches from the first state and second state.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 4 is a table of reading signal versus data state of an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
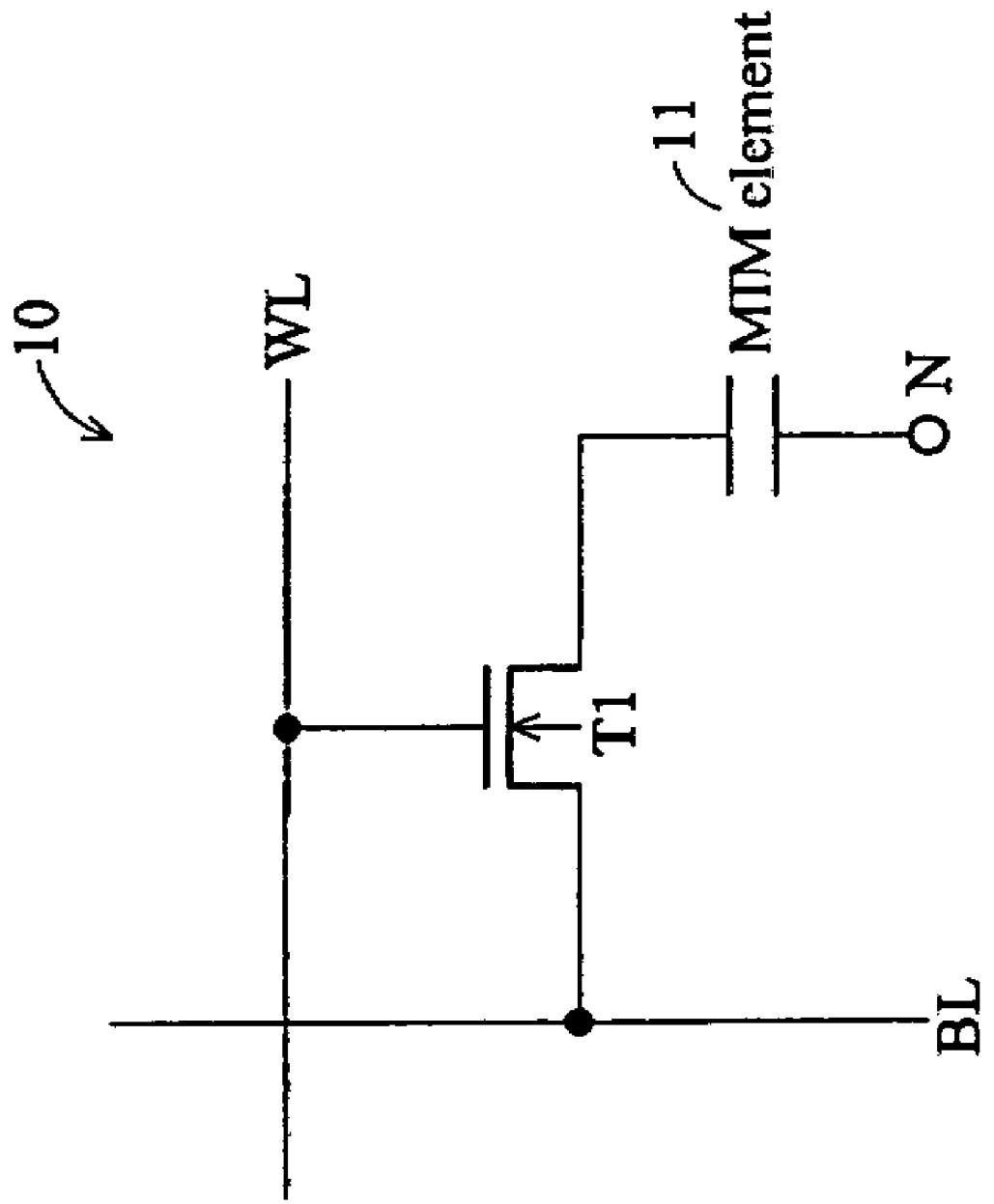
FIG. 1 is a schematic diagram of a memory cell of RRAM.
Figure 2:
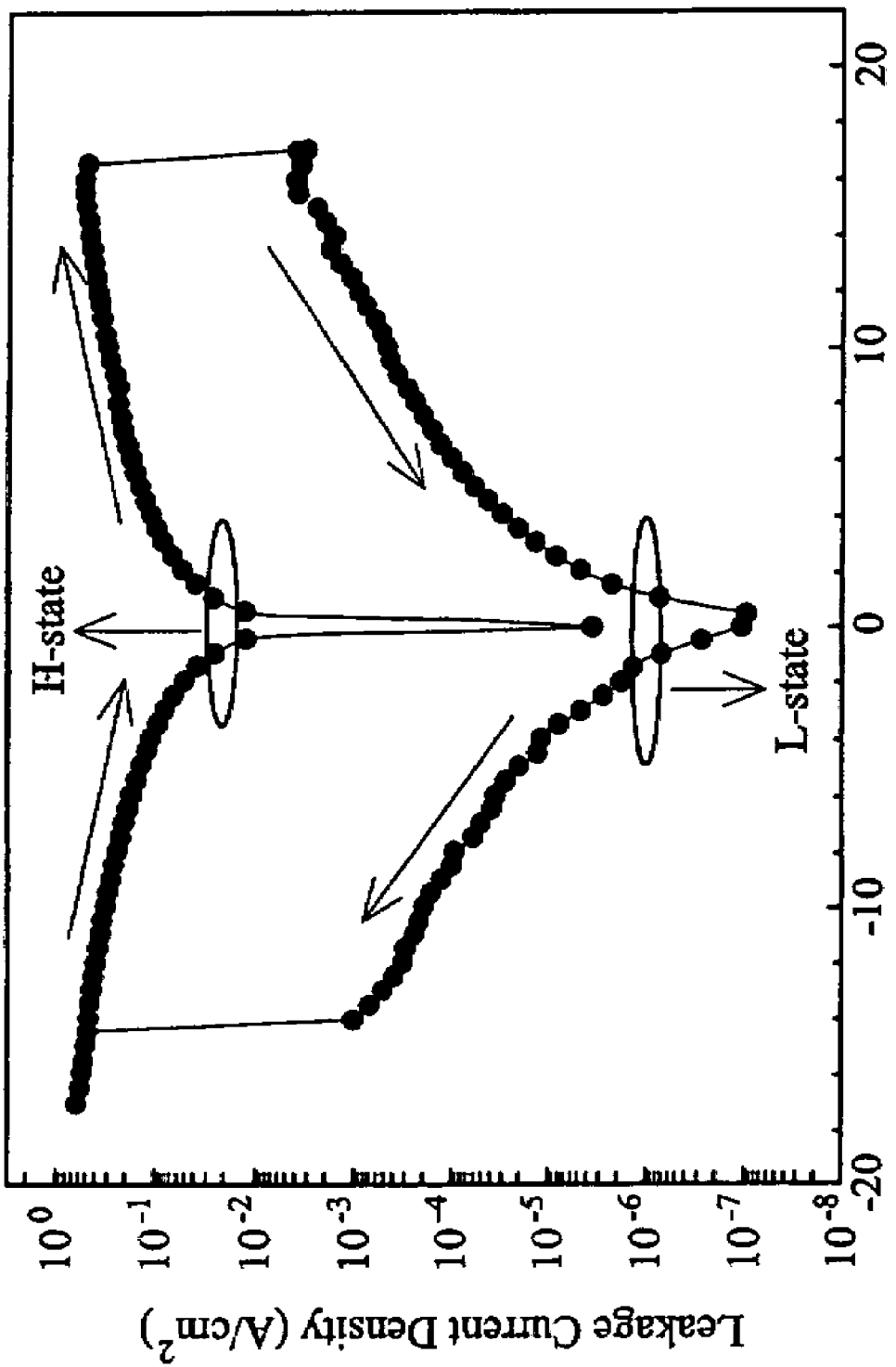
FIG. 2 shows a schematic diagram of the leakage current density versus bias voltage of an MIM element.

FIG. 2 shows a schematic diagram of the leakage current density versus bias voltage of an MIM element. In FIG. 2, it is found that the leakage current density rapidly decreases from H-state to L-state at 15V and rapidly increases from L-state to H-state at −15V, in other words, the resistance of the MIM element rapidly increases at 15V and rapidly decreases at −15V. If the data stored in the MIM element has only two data states, the data state of data can be switched by applying voltage at 15V or −15V for a period of time. Generalizing speaking, when the MIM element is in L-state, applying a transition voltage, such as 15V, for a period of time switches the MIM element to H-state and when the MIM element is in H-state, applying a transition voltage, such as −15V, for a period of time switches the MIM element to L-state.

According to the characteristic of the MIM device described in FIG. 2, when a reading pulse having a pulse width less than the transition time of the MIM element and a voltage larger than the transition voltage, the MIM element does not change state. However, if two continuous reading pulses with total pulse width larger than the transition time are applied to the MIM element, the MIM element is forced to change state.

Figure 3:
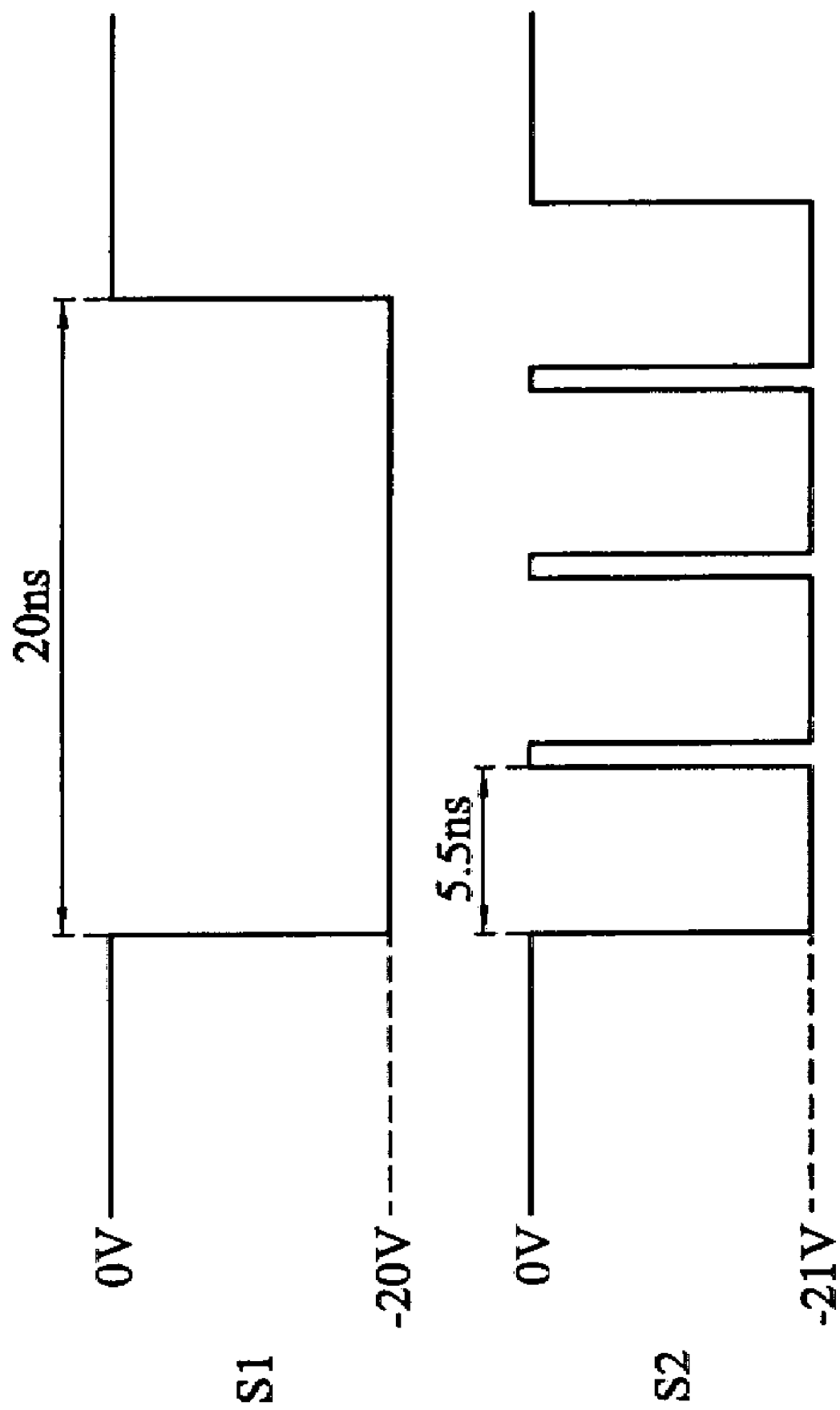
FIG. 3 is a schematic diagram of an embodiment of reading signal of the MIM element in RRAM.

Thus, assume that the transition voltage for switching the MIM element from L-state to H-state is −20V and transition time is 20 ns. In one embodiment, the MIM element can store four logic state data, logic state 0, logic state 1, logic state 2, and logic state 3. Thus, a read/write signal complied with the rule that the MIM element only changes from L-state to H-state after receiving fourth read/write signals is desirable. FIG. 3 is a schematic diagram of an embodiment of reading signal of the MIM element in RRAM. Signal S1 is used for a conventional method for switching the MIM element from L-state to H-state, and signal S2 is an embodiment of the reading signal of the invention. The width of signal S2 is 5.5 ns and only when the fourth signal S2 is input to the MIM element, the MIM element changes state.

To further illustrate the embodiment, please refer to FIG. 4. FIG. 4 is a table of reading signal versus data state of an embodiment of the invention. In this embodiment, the voltage of the read/write signal is −21V and the width is 5.5 ns. When the MIM element changes to H-state after receiving four continuous read/write signals, the data stored in the MIM element is a logic state 0 data. When the MIM element changes to H-state after receiving three read/write signals, the data stored in the MIM element is a logic state 1 data. When the MIM element changes to H-state after receiving two read/write signals, the data stored in the MIM element is a logic state 2 data. When the MIM element changes to H-state after receiving one read/write signal, the data stored in the MIM element is a logic state 3 data.

Figure 5:
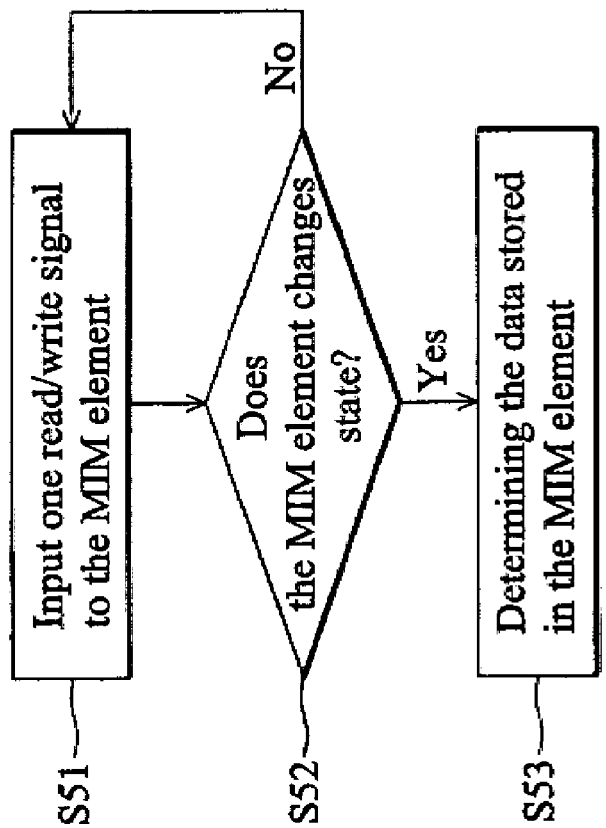
FIG. 5 is a flowchart of an embodiment of the reading method of the invention.

FIG. 5 is a flowchart of an embodiment of the reading method of the invention. In step S51, the first read/write signal is input to the MIM element. In step S52, a state detector (not shown in Figs.) detects whether the state of the MIM element changes. When the MIM element changes state, the procedure jumps to step S53, and if the MIM element does not change state, the procedure jumps to step S51. In step S53, the data stored in the MIM element is determined by the number of the input read/write signals. In a general case, if the MIM can store N logic state data and the MIM element changes state after receiving M read/write signals, the data stored in the MIM element is a logic state (N-M) data.

Figure 6:
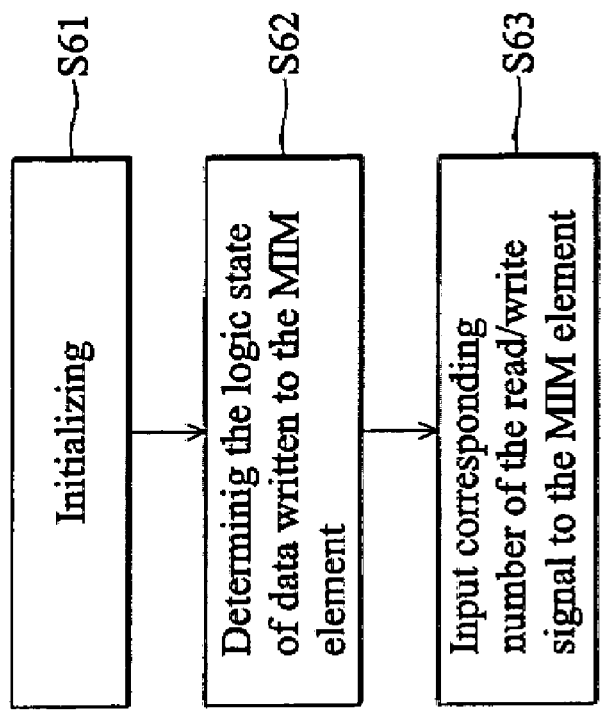
FIG. 6 is a flowchart of an embodiment of the writing method of the invention.

Furthermore, a method for writing to memory with multiple data states of the invention is provided. At first, a erasing voltage, such as 20V of FIG. 2, is applied to the MIM element to ensure that the MIM element is at L-state and then at least one read/write signal is input to the MIM element based on the written data. For example, assuming the transition voltage for switching the MIM element from L-state to H-state is −20V, the transition time is 20 ns and the MIM element has four logic states, thus, the voltage of the read/write signal should be larger than 20V and the writing cycle is larger than 5 ns. In one example, the read/write signal is the signal S2 in FIG. 3. Please refer to FIG. 6. FIG. 6 is a flowchart of an embodiment of the writing method of the invention. In step S61, the MIM element receives an erasing signal to make sure that the state of the MIM element is at L-state. In this embodiment the voltage of the erasing signal should be larger than 20V and the width of the erasing signal is larger than 20 ns. In step S62, a controller (not shown in Figs.) determines the logic states of the written data, and in step S63, the controller inputs corresponding read/write signals to the MIM element. If the written data is a logic state 0 data, no read/write signal is input to the MIM element. If the written data is a logic state 1 data, one read/write signal is input to the MIM element. If the written data is a logic state 2 data, two read/write signals are input to the MIM element. If the written data is a logic state 3 data, three read/write signals are input to the MIM element.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reading method for a memory having a MIM element, comprising:
    determining a transition voltage and a transition time of the MIM element, wherein the transition voltage switches the MIM element from a first state to a second state and the transition time is the shortest switching time for switching the MIM element from the first state to the second state;
    determining N logic states of the MIM element, wherein N is more than two;
    providing a reading signal, wherein the reading signal has a reading voltage more than the transition voltage and a reading cycle T, wherein a product of N and T is larger than the transition time;
    selecting a memory cell via a word line and a bit line of the memory;
    inputting a series of the reading signal to the memory cell via the bit line; and
    determining the logic state of the data when the MIM element switches to the second state at the Mth reading signal.

2. The method as claimed in claim 1, wherein N is more than or equal to M.

3. The method as claimed in claim 1, the logic state of the data is (N-M) when the MIM element switches to the second state at the Mth reading signal.

4. A writing method for a memory having a MIM element, comprising:
- determining a transition voltage and a transition time of the MIM element, wherein the transition voltage switches the MIM element from a first state to a second state and the transition time is the shortest switching time for switching the MIM element from the first state to the second state;
- determining N logic states of the MIM element, wherein N is more than two;
- providing a writing signal, wherein the writing signal has a writing voltage more than the transition voltage and a writing cycle T, wherein a product of N and T is larger than the transition time;
- selecting a memory cell; and
- input the writing signal to the MIM element of the selected memory cell based on an input data.

5. The method as claimed in claim 4, wherein when the input data is at logic state M, M writing signals are input to the MIM element.

6. The method as claimed in claim 4, wherein N is more than or equal to M.

7. The method as claimed in claim 4, wherein the writing signal is input to the MIM element via a bit line coupled to the MIM element.

8. The method as claimed in claim 4, further comprising an initializing step to clear data stored in the MIM element.

9. The method as claimed in claim 8, wherein the initializing step is achieved by an erasing signal.

10. The method as claimed in claim 8, wherein the voltage of the erasing signal is larger than the transition voltage, and the width of the erasing signal is larger than the transition time.

11. An accessing method for a memory having a MIM element, comprising:
- determining a first transition voltage and a first transition time of the MIM element, wherein the first transition voltage switches the MIM element from a first state to a second state and the first transition time is the shortest switching time for switching the MIM element from the first state to the second state;
- determining a second transition voltage and a second transition time of the MIM element, wherein the second transition voltage switches the MIM element from the second state to the first state and the second transition time is the shortest switching time for switching the MIM element from the second state to the first state;
- determining N logic states of the MIM element, wherein N is more than two;
- providing a reading signal, wherein the reading signal has a reading voltage more than the first transition voltage and a reading cycle T, wherein a product of N and T is more than the first transition time;
- providing a writing signal, wherein the writing signal has a writing voltage more than the second transition voltage and a writing cycle T, wherein a product of N and T is more than the second transition time;
- selecting a memory cell via a word line and a bit line of the memory;
- when the memory cell is at a writing mode, applying at least one writing signal to the MIM element of the memory cell via the bit line based on the data state of a writing data; and
- when the memory cell is at a reading mode, applying at least one reading signal to the memory cell and determining the logic state of the data stored in the memory cell when the MIM element switches from the first state and second state.

12. The method as claimed in claim 11, wherein when the MIM element switches to the second state at the Mth reading signal, the data stored in the memory is at logic (N-M).

13. The method as claimed in claim 11, wherein when a data at logic state M is written to the memory cell, M continuous writing signal are input to the MIM element.

14. A reading method for a memory having a MIM element, comprising:
- inputting at least one read signal to the MIM element;
- detecting whether the sate of the MIM element changes; and
- when the MIM element changes state, determining the data stored in the MIM element based on the number of the input reading signal.

* * * * *